(12) United States Patent
Lin et al.

(10) Patent No.: US 10,854,713 B2
(45) Date of Patent: Dec. 1, 2020

(54) METHOD FOR FORMING TRENCH STRUCTURE OF SEMICONDUCTOR DEVICE

(71) Applicant: TAIWAN SEMICONDUCTOR MANUFACTURING CO., LTD., Hsinchu (TW)

(72) Inventors: Jia-Ming Lin, Tainan (TW); Shiu-Ko Jangjian, Tainan (TW); Chun-Che Lin, Tainan (TW); Ying-Lang Wang, Taichung (TW); Wei-Ken Lin, Tainan (TW); Chuan-Pu Liu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 194 days.

(21) Appl. No.: 15/865,072

(22) Filed: Jan. 8, 2018

(65) Prior Publication Data
US 2018/0151667 A1 May 31, 2018

Related U.S. Application Data

(62) Division of application No. 14/812,864, filed on Jul. 29, 2015, now Pat. No. 9,871,100.

(51) Int. Cl.
*H01L 21/3105* (2006.01)
*H01L 21/314* (2006.01)
(Continued)

(52) U.S. Cl.
CPC ........ *H01L 29/0653* (2013.01); *H01L 21/022* (2013.01); *H01L 21/0214* (2013.01); *H01L 21/02164* (2013.01); *H01L 21/02219* (2013.01); *H01L 21/02271* (2013.01); *H01L 21/02326* (2013.01); *H01L 21/02337* (2013.01);
(Continued)

(58) Field of Classification Search
CPC ......... H01L 21/02219; H01L 21/02271; H01L 21/02274; H01L 21/823431; H01L 21/823481; H01L 21/823821; H01L 21/823878; H01L 21/324; H01L 21/31051; H01L 21/0214; H01L 21/02164; H01L 21/02326; H01L 21/02337; H01L 27/0886; H01L 27/1211; H01L 29/785; C23C 16/56
See application file for complete search history.

(56) References Cited

U.S. PATENT DOCUMENTS 5,869,384 A * 2/1999 Yu .................... H01L 21/76224
257/E21.546
6,051,478 A 4/2000 Ibok
(Continued)

FOREIGN PATENT DOCUMENTS

CN 1591817 A 3/2005
CN 102201360 A 9/2011
(Continued)

*Primary Examiner* — Mary A Wilczewski
(74) *Attorney, Agent, or Firm* — Maschoff Brennan

(57) ABSTRACT

A method includes forming a flowable dielectric layer in a trench of a substrate; curing the flowable dielectric layer; and annealing the cured flowable dielectric layer to form an insulation structure and a liner layer. The insulation structure is formed in the trench, the liner layer is formed between the insulation structure and the substrate, and the liner layer includes nitrogen.

20 Claims, 8 Drawing Sheets

(51) Int. Cl.
  *H01L 21/324* (2006.01)
  *H01L 21/762* (2006.01)
  *H01L 21/8234* (2006.01)
  *H01L 27/088* (2006.01)
  *H01L 29/78* (2006.01)
  *H01L 29/06* (2006.01)
  *H01L 21/02* (2006.01)
  *H01L 21/3065* (2006.01)
  *H01L 27/12* (2006.01)
  *H01L 21/84* (2006.01)

(52) U.S. Cl.
  CPC .... *H01L 21/3065* (2013.01); *H01L 21/31051* (2013.01); *H01L 21/324* (2013.01); *H01L 21/76224* (2013.01); *H01L 21/823431* (2013.01); *H01L 21/823481* (2013.01); *H01L 27/0886* (2013.01); *H01L 21/845* (2013.01); *H01L 27/1211* (2013.01); *H01L 29/785* (2013.01)

(56) References Cited

U.S. PATENT DOCUMENTS

| | | | |
|---|---|---|---|
| 6,218,720 B1 | 4/2001 | Gardner et al. | |
| 6,258,692 B1 | 7/2001 | Chu et al. | |
| 6,600,195 B1 | 7/2003 | Nishida et al. | |
| 6,709,951 B2 | 3/2004 | Beyer et al. | |
| 6,764,922 B2 | 7/2004 | Beyer et al. | |
| 6,953,734 B2 | 10/2005 | Lim et al. | |
| 6,960,781 B2 | 11/2005 | Currie et al. | |
| 7,112,513 B2* | 9/2006 | Smythe, III | H01L 21/76224 257/E21.54 |
| 7,163,869 B2 | 1/2007 | Kim et al. | |
| 7,199,020 B2 | 4/2007 | Mehrotra et al. | |
| 7,550,363 B2 | 6/2009 | Lee | |
| 7,670,954 B2 | 3/2010 | Ohashi | |
| 7,919,829 B2 | 4/2011 | Trivedi et al. | |
| 7,947,551 B1* | 5/2011 | Syue | H01L 21/02274 257/374 |
| 8,557,712 B1* | 10/2013 | Antonelli | H01L 21/02164 438/761 |
| 8,580,649 B2 | 11/2013 | Miyahara et al. | |
| 8,728,958 B2 | 5/2014 | Ashtiani et al. | |
| 8,772,904 B2* | 7/2014 | Liu | H01L 21/76224 257/510 |
| 8,823,132 B2* | 9/2014 | Liou | H01L 21/76235 257/506 |
| 8,889,523 B2 | 11/2014 | Sun et al. | |
| 9,117,878 B2* | 8/2015 | Lin | H01L 21/02164 |
| 9,130,014 B2* | 9/2015 | Lin | H01L 21/76237 |
| 9,257,302 B1* | 2/2016 | Wang | H01L 21/31604 |
| 9,299,775 B2 | 3/2016 | Bentley et al. | |
| 9,548,362 B2 | 1/2017 | Ching et al. | |
| 9,564,353 B2 | 2/2017 | Huang et al. | |
| 9,773,893 B1* | 9/2017 | Bu | H01L 29/785 |
| 10,249,730 B1* | 4/2019 | Belyansky | H01L 21/82343 |
| 10,460,933 B2* | 10/2019 | Manna | H01L 21/02617 |
| 2002/0100952 A1 | 8/2002 | Hong | |
| 2004/0080018 A1 | 4/2004 | Kim et al. | |
| 2004/0238914 A1 | 12/2004 | Deshpande et al. | |
| 2005/0035426 A1 | 2/2005 | Ko et al. | |
| 2005/0224907 A1 | 10/2005 | Ko et al. | |
| 2007/0155187 A1 | 7/2007 | Chen et al. | |
| 2007/0281496 A1* | 12/2007 | Ingle | C23C 16/452 438/778 |
| 2008/0157266 A1 | 7/2008 | Chen et al. | |
| 2008/0224234 A1 | 9/2008 | Sasaki | |
| 2008/0286936 A1 | 11/2008 | Zhao | |
| 2008/0293213 A1 | 11/2008 | Yang et al. | |
| 2009/0020847 A1 | 1/2009 | Byun et al. | |
| 2009/0104791 A1* | 4/2009 | Nemani | C23C 16/045 438/788 |
| 2009/0159981 A1 | 6/2009 | Niimi et al. | |
| 2010/0012990 A1 | 1/2010 | Kim et al. | |
| 2010/0087043 A1 | 4/2010 | Cheng et al. | |
| 2010/0230757 A1 | 9/2010 | Chen et al. | |
| 2010/0240194 A1 | 9/2010 | Jung et al. | |
| 2011/0127634 A1 | 6/2011 | Eun | |
| 2011/0151678 A1* | 6/2011 | Ashtiani | H01L 21/0217 438/786 |
| 2011/0217851 A1* | 9/2011 | Liang | H01L 21/02271 438/786 |
| 2012/0149213 A1* | 6/2012 | Nittala | C23C 16/02 438/783 |
| 2013/0087857 A1 | 4/2013 | Ko et al. | |
| 2013/0193578 A1* | 8/2013 | Yu | H01L 21/76844 257/751 |
| 2013/0230987 A1* | 9/2013 | Draeger | H01L 21/02126 438/694 |
| 2014/0264720 A1 | 9/2014 | Lee et al. | |
| 2014/0329027 A1* | 11/2014 | Liang | C23C 16/452 427/551 |
| 2015/0099342 A1* | 4/2015 | Tsai | H01L 21/76237 438/400 |
| 2015/0104923 A1* | 4/2015 | Tsai | H01L 21/76224 438/424 |
| 2015/0380241 A1 | 12/2015 | Yu et al. | |
| 2016/0013051 A1* | 1/2016 | Zeng | H01L 21/3105 257/368 |
| 2016/0163700 A1 | 6/2016 | Peng et al. | |
| 2016/0190240 A1* | 6/2016 | Fang | H01L 29/0649 257/506 |
| 2017/0033179 A1* | 2/2017 | Lin | H01L 21/31051 |
| 2017/0352559 A1* | 12/2017 | Liu | H01L 23/485 |
| 2018/0151564 A1* | 5/2018 | Lee | H01L 29/66545 |
| 2018/0151667 A1* | 5/2018 | Lin | H01L 21/31051 |
| 2018/0166327 A1* | 6/2018 | Hsiao | H01L 21/76802 |
| 2018/0350693 A1* | 12/2018 | Huang | H01L 21/02274 |
| 2019/0035691 A1* | 1/2019 | Okuno | H01L 27/0924 |
| 2019/0067079 A1* | 2/2019 | Belyansky | H01L 21/762 |
| 2019/0164848 A1* | 5/2019 | Chung | H01L 21/823437 |
| 2019/0165174 A1* | 5/2019 | Peng | H01L 29/66795 |
| 2019/0252522 A1* | 8/2019 | Thees | H01L 21/30604 |
| 2019/0259625 A1* | 8/2019 | Nemani | H01L 21/02129 |
| 2019/0273014 A1* | 9/2019 | Tsai | H01L 21/02337 |
| 2020/0161123 A1* | 5/2020 | Kao | H01L 21/823487 |

FOREIGN PATENT DOCUMENTS

| | | |
|---|---|---|
| KR | 10-0564989 B1 | 3/2006 |
| KR | 10-2012-0099243 A | 9/2012 |

\* cited by examiner

METHOD FOR FORMING TRENCH STRUCTURE OF SEMICONDUCTOR DEVICE

PRIORITY CLAIM AND CROSS-REFERENCE

This application is a divisional application of U.S. patent application Ser. No. 14/812,864, filed Jul. 29, 2015, now U.S. Pat. No. 9,871,100, issued Jan. 16, 2018. All of these applications are incorporated herein by reference.

BACKGROUND

Trench structures, such as shallow trench isolations (STIs), are used to separate and isolate active areas on a semiconductor wafer from each other. As circuit densities continue to increase, the widths of trenches of STIs decrease, thereby increasing the aspect ratios of the STI trenches. Aspect ratio of a trench (or a gap) is defined as the trench height (or gap height) divided by the trench width (or gap width). Incomplete gap-filling results in unwanted voids and increases the risk of inclusion of unwanted defects when the unwanted voids are exposed during removal of excess dielectric. The voids may also result in inadequate isolation between active areas. The presence of voids in STI would affect yield.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
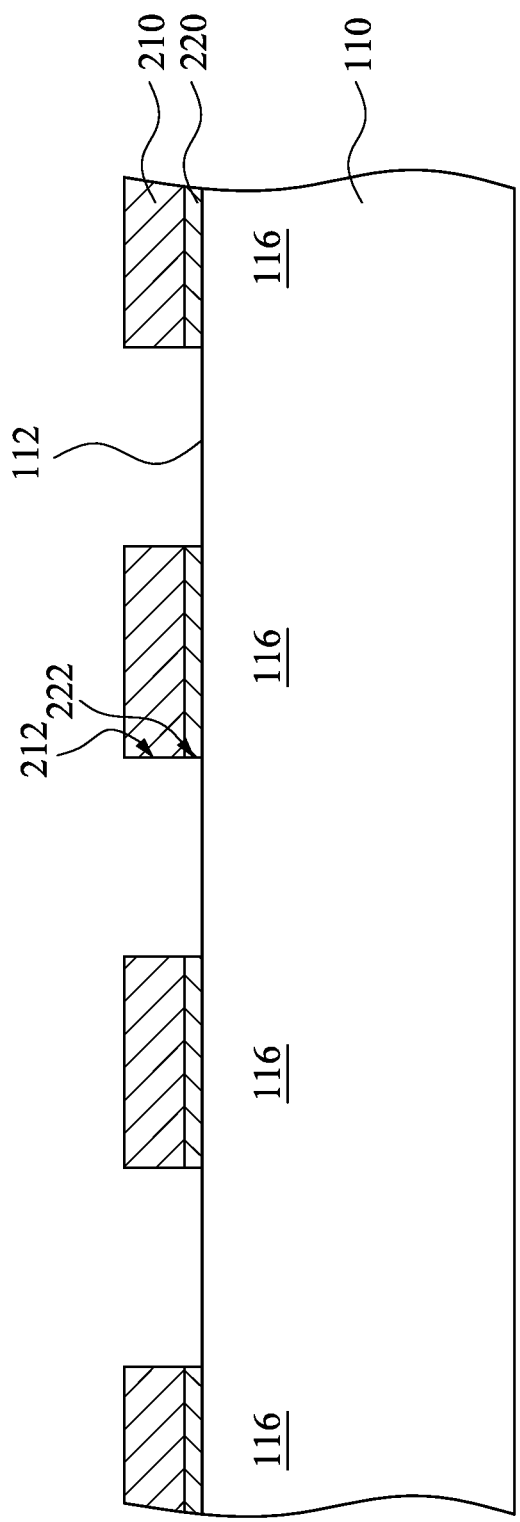
FIGS. 1 to 8 are cross-sectional views of a method for manufacturing a trench structure of a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

With the size decrease of semiconductor devices, the sizes of various features associated with forming semiconductor devices also decrease. One such feature is the shallow trench isolation (STI) formed between active regions to provide isolation. As discussed, the feature size reduction results in increased aspect ratios because the openings are smaller but not the depth of the trench. Techniques used to fill trenches having lower aspect ratios are hard to be used to adequately fill trenches of technologies having high aspect ratios. Therefore, a trench structure of a semiconductor device and method for manufacturing the trench structure are provided. The intermediate stages in the manufacturing of embodiments are illustrated, and the variations of the embodiments are also discussed.

FIGS. 1 to 8 are cross-sectional views of a method for manufacturing a trench structure of a semiconductor device at various stages in accordance with some embodiments of the present disclosure. Reference is made to FIG. 1. A substrate 110 is provided. The substrate 110 has a top surface 112. In some embodiments, the substrate 110 may include silicon (Si). Alternatively, the substrate 110 may include germanium (Ge), silicon germanium, gallium arsenide (GaAs) or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

A patterned mask layer 210 (may be a hard mask layer) is formed over the top surface 112 of the substrate 110. The mask layer 210 maintains the integrity of the patterns during etching of a trench 114 (see FIG. 2) formed in the substrate 110. In some embodiments, the mask layer 210 is used as a planarization stop layer during the removal of excess flowable dielectric layer that fills the trench 114 (discussed in the process of FIG. 8). In some embodiments, the mask layer 210 includes nitride. For example, the mask layer 210 is made of silicon nitride (SiN). However, other materials, such as SiON, silicon carbide, or a combination thereof, may also be used. The thickness of mask layer 210 can be in a range from about 200 nm to about 1200 nm. The mask layer 210 may be formed by a process such as chemical vapor deposition (CVD), plasma enhanced chemical vapor deposition (PECVD), or low pressure chemical vapor deposition (LPCVD). Alternatively, the mask layer 210 may be first made of a silicon oxide and then converted to SiN by nitridation.

In some embodiments, a protective layer 220 is formed over the top surface 112 of the substrate 110 and between the mask layer 210 and the substrate 110. The protective layer 220 protects the top surface 112 from direct contact with the mask layer 210. For example, for a portion of the substrate 110 next to the trench 114 (see FIG. 2) which is filled by the insulation structure 120 (see FIG. 8), the protective layer 220 can protect active regions 116 formed in the portion of the substrate 110. The active regions 116 are used for forming devices (such as transistors, resistors, etc.) after the insulation structure 120 are formed. Depending upon the devices to be formed, the active regions 116 may include either an n-well or a p-well as determined by the design conditions. In some embodiments, the protective layer 220 is made of a thermal oxide. The thickness of the protective layer 220 may be in a range from about 20 nm to about 100 nm. Once formed, the mask layer 210 and the proactive layer 220 are patterned through suitable photolithographic and etching processes to form openings 212 and 222 over the top surface 112 for the trench 114 of FIG. 2.

Figure 2:
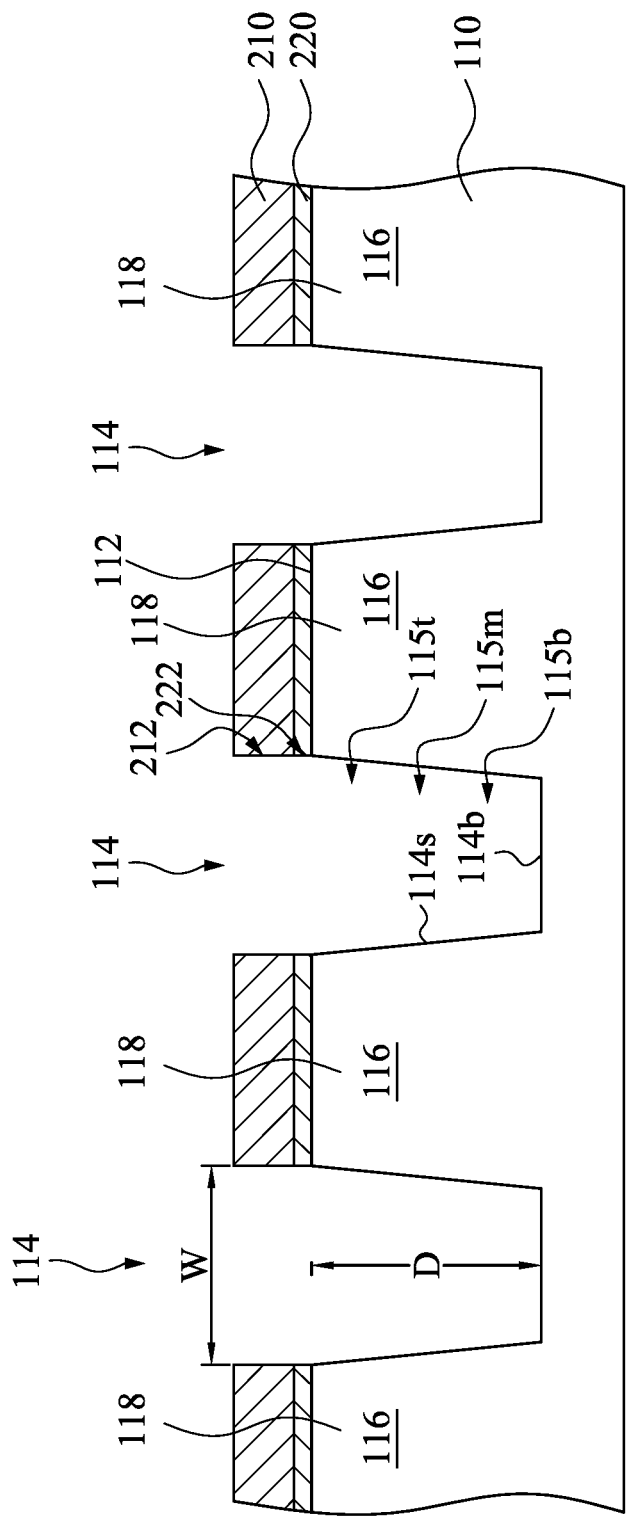

Reference is made to FIG. 2. The exposed portions of the substrate 110 through the openings 212 and 222 are removed by an etching process, such as reactive ion etching (RIE), in order to form the trench 114 in the substrate 110. The trench 114 faces the top surface 112 of the substrate 110 and separates the active regions 116 near the top surface 112 of the substrate 110. The trench 114 has at least one sidewall 114$s$ and a bottom surface 114$b$. The sidewall 114$s$ is adjacent to the top surface 112 of the substrate 110 and connects the top surface 112 of the substrate 110 and the bottom surface 114$b$ of the trench 114. In some embodiments, the trench 114 has a width W in a range from about 20 nm to about 100 nm. In some embodiments, the trench 114 has a depth D in a range from about 50 nm to about 350 nm. An aspect ratio, the depth D (sometimes referred to herein as trench height) divided by the width W, of the trench 114 can be greater than greater than about 7. In some other embodiments, the aspect ratio may even be greater than about 8, although it may also be lower than about 7, or between 7 and 8. One skilled in the art will realize, however, that the dimensions and values recited throughout the descriptions are merely examples, and may be changed to suit different scales of semiconductor devices.

The trench 114 has a bottom portion 115$b$ and a top portion 115$t$. The bottom portion 115$b$ is closer to the bottom surface 114$b$ than the top portion 115$t$, and the top portion 115$t$ is adjacent to the top surface 112 of the substrate 110. The trench 114 further has a middle portion 115$m$ between the top portion 115$t$ and the bottom portion 115$b$. In some embodiments, the top portion 115$t$, the middle portion 115$m$, and the bottom portion 115$b$ can have substantially the same height.

In some embodiments, the semiconductor device can be a Fin field effect transistor (FinFET), and the trench 114 is configured to separate adjacent two semiconductor fins 118 formed in the substrate 110. In other words, one of the semiconductor fins 118 is disposed between adjacent two of the trenches 114.

Figure 3:
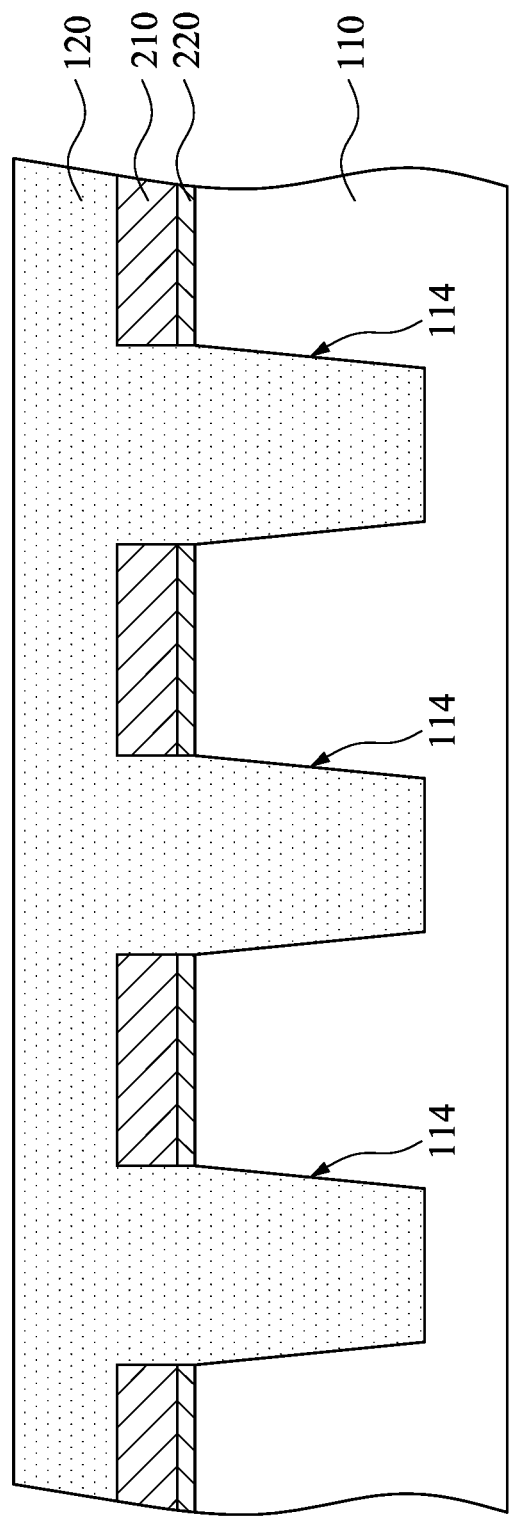

Reference is made to FIG. 3. A flowable dielectric material overfills the trench 114 and the mask layer 210 to form a flowable dielectric layer 120'. The flowable dielectric layer 120' can be formed by using a spin on dielectric (SOD) formation process, or by depositing a flowable dielectric by a chemical vapor deposition (CVD) process, such as radical-component CVD. The examples of flowable silicon oxide precursors, include a silicate, a siloxane, a methyl Silses-Quioxane (MSQ), a hydrogen SisesQuioxane (HSQ), an MSQ/HSQ, a perhydrosilazane (TCPS), a perhydro-polysilazane (PSZ), a tetraethyl orthosilicate (TEOS), or a silylamine (SA).

In some embodiments, the flowable dielectric layer 120' is deposited by using a silicon-containing precursor to react with another precursor, such as a "radical-nitrogen" precursor generated by a plasma. In some embodiments, the silicon-containing precursor is carbon-free and includes silyl-amines, such as $H_2N(SiH_3)$, $HN(SiH_3)_2$, $N(SiH_3)_3$, or combinations thereof. The silyl-amines may be mixed with additional gases that may act as carrier gases, reactive gases, or both. Examples of the additional gases may include $H_2$, $N_2$, $NH_3$, He, and Ar, among other gases. Silyl-amines may also be mixed with other carbon-free silicon-containing gas(es), such as silane ($SiH_4$) and disilane ($Si_2H_6$), hydrogen (e.g. $H_2$), and/or nitrogen (e.g. $N_2$, $NH_3$).

Nitrogen may be included in either or both of the radical precursor and the silicon-containing precursor. When nitrogen is present in the radical precursor, it may be referred to as a radical-nitrogen precursor. The radical-nitrogen precursor includes plasma effluents created by exciting a more stable nitrogen-containing precursor in plasma. For example, a relatively stable nitrogen-containing precursor containing $NH_3$ and/or hydrazine ($N_2H_4$) may be activated in a chamber plasma region or a remote plasma system (RPS) outside the processing chamber to form the radical-nitrogen precursor, which is then transported into a plasma-free substrate processing region. The stable nitrogen precursor may also be a mixture including a combination of $NH_3$, $N_2$, and $H_2$.

The radical-nitrogen precursor may also be accompanied by a carrier gas such as argon, helium, etc. Oxygen may be simultaneously delivered into the remote plasma region (in the form of $O_2$ and/or $O_3$) to adjust the amount of oxygen content in the radical-nitrogen precursor for forming the flowable dielectric layer 120' deposited with this technique.

The deposition of the flowable dielectric layer 120' may proceed while the temperature of the substrate 110 is maintained at a relatively low temperature. In some embodiments, the flowable dielectric layer 120' is deposited on the substrate 110 at low temperature which is maintained by cooling the substrate 110 during the deposition. In some embodiments, the deposition is performed at a temperature in a range from about −40° C. to about 200° C. In some embodiments, the deposition is performed at a temperature less than about 100° C.

In some embodiments, the deposition pressure is in a range from about 100 mTorr to about 10 Torr. In some embodiments, reaction source uses a gaseous environment including trisilylamine ($Si_3H_9N$, or TSA) and $NH_3$. In some embodiments, the flow rates of $Si_3H_9N$ and $NH_3$ are in the range of about 100 sccm to about 1000 sccm, and of about 100 sccm to about 2000 sccm, respectively.

The as-deposited flowable dielectric layer 120' is capable of filling the narrow and deep gaps and prevents voids and discontinuities in the trench 114. The as-deposited flowable dielectric layer 120' includes a flowable network of $SiO_AN_BH_C$ (or SiONH). In some embodiments, A is a number in a range from about 0.8 to about 2, B is a number from about 0.01 to about 1, and C is a number from about 0.01 to about 1. In some embodiments, the thickness of the flowable dielectric layer 120' above the mask layer 210 is in a range from about 1000 angstrom to about 3000 angstrom.

Figure 4:
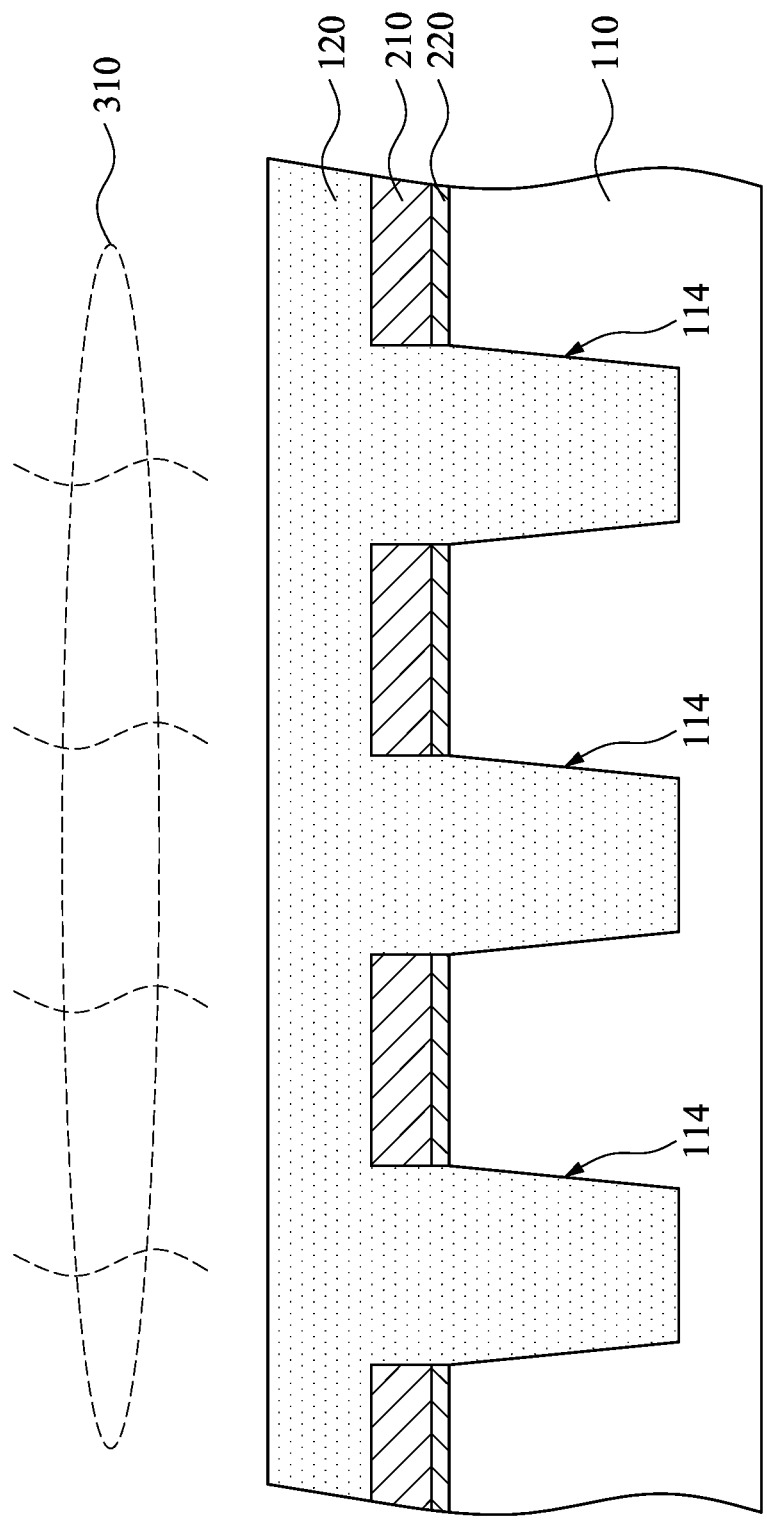

Reference is made to FIG. 4. After the flowable dielectric layer 120' is deposited, an in-situ curing process 310 can be performed on the as-deposited flowable dielectric layer 120'. In-situ means the curing process 310 is performed in the process chamber for depositing the flowable dielectric layer 120'. In some embodiments, the curing process 310 can be performed in a different chamber (or ex-situ).

In some embodiments, the curing process 310 is operated using ozone ($O_3$) (oxidation treatment) with a flow rate in the range of about 100 sccm to about 5000 sccm, or using steam with a flow rate in a range from about 100 sccm to about 5000 sccm. A temperature for the curing process 310 is in a range of about 10° C. to about 500° C., in some embodiments. Alternatively, steam can be used during the curing process, instead of $O_3$. A pressure range for the curing process 310 is from about 1 Torr to about 760 Torr, in some embodiments. The duration of the curing process 310 is in a range from about 10 seconds to about 2 hrs, in accordance with some embodiments. The curing process 310 increases the oxygen content of the as-deposited flowable dielectric layer 120', which is made of a network of $SiO_AN_BH_C$ (or SiONH), and most of NH ions and H ions of the flowable dielectric layer 120' can be removed.

Figure 5:
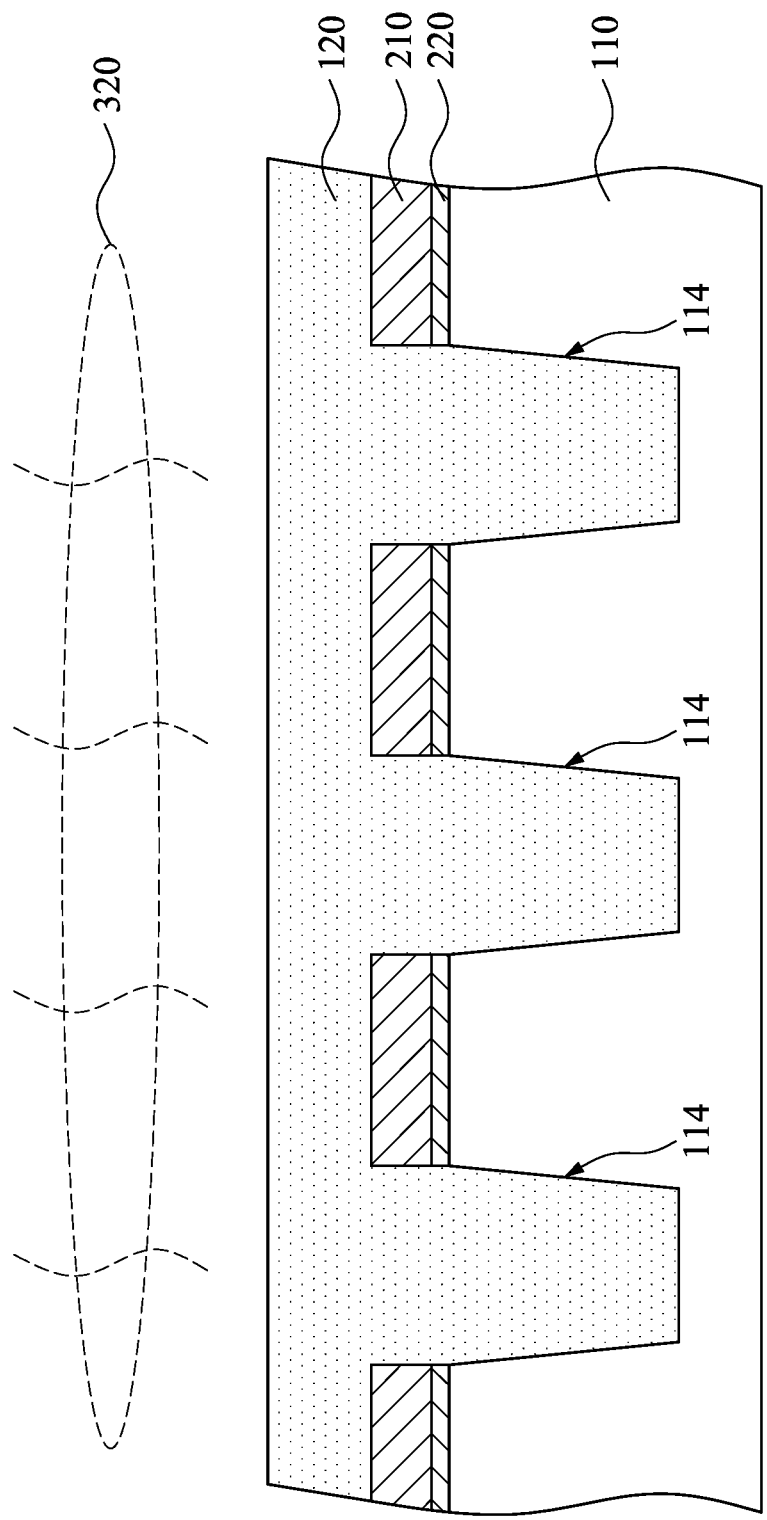

Reference is made to FIG. 5. In order to convert the SiONH network into a SiO (or $SiO_2$) network, an additional thermal anneal 320 can be performed. The thermal anneal can be conducted at a temperature in a range from about 200° C. to about 1100° C. An oxygen source, such as steam, can be provided to assist the conversion of the SiONH network into SiO network.

Figure 6:
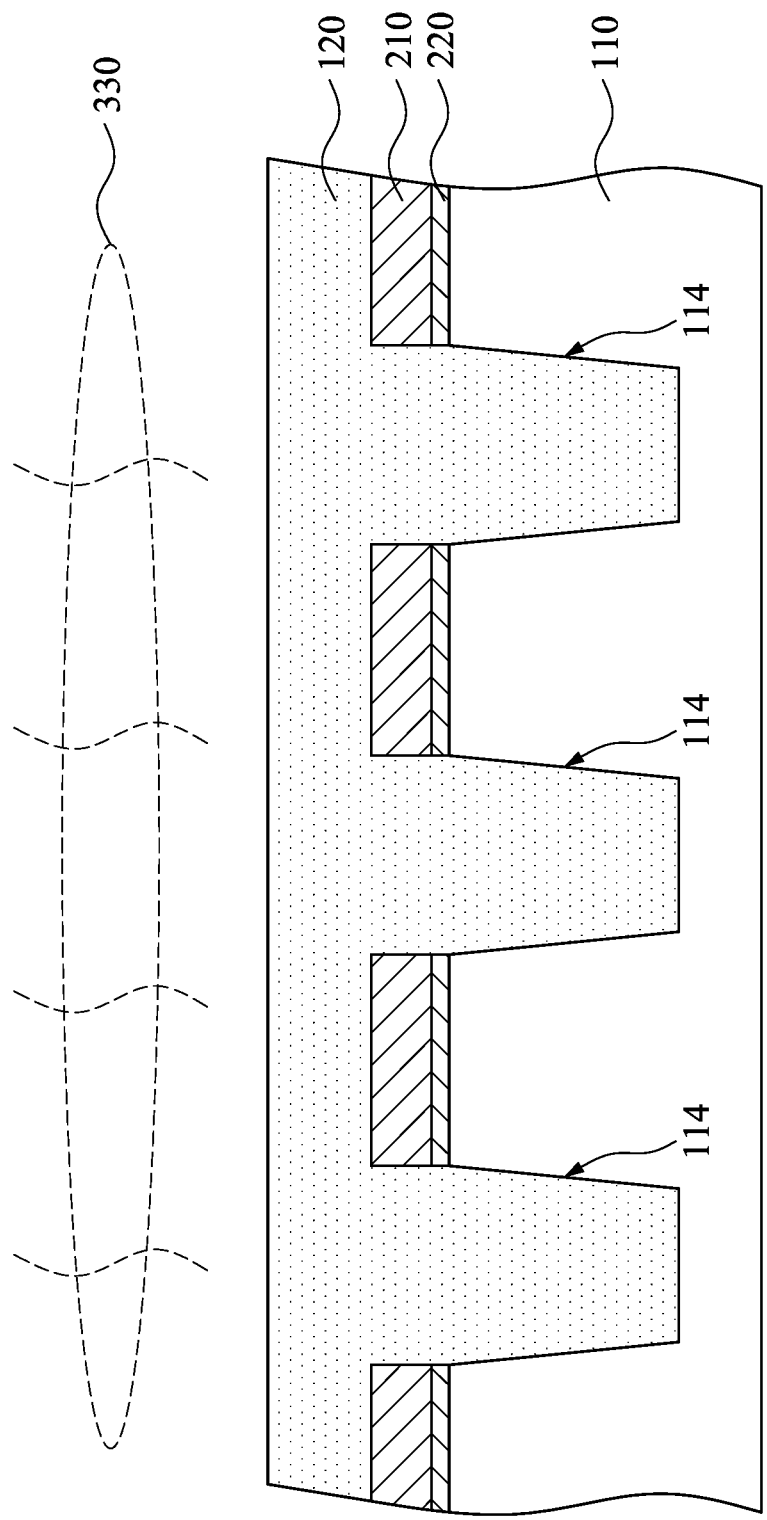

Reference is made to FIG. 6. After the thermal anneal 320 described above is performed, the substrate 110 undergoes a steam thermal anneal process 330. The steam ($H_2O$) converts the SiONH network to SiOH and SiO network. The steam thermal anneal process 330 is conducted in a furnace, in some embodiments. The steam thermal anneal process 330 is at a temperature in a range of about 150° C. to about 800° C., in some embodiments. The steam thermal anneal process 330 starts at about 150° C. and ramps up the temperature gradually to a predetermined temperature of about 500° C. to about 800° C. The pressure of the steam thermal anneal process 330 is in a range from about 500 Torr to about 800 Torr. The flow rate of steam is in a range from about 1 slm to about 20 slm. The duration of the steam thermal anneal process 330 is in a range from about 20 minites to about 2 hours. The steam thermal anneal proves 330 converts the SiONH network in the flowable dielectric layer 120' to a network of SiOH and SiO. The steam thermal anneal process 330 causes the flowable dielectric layer 120' to shrink. The duration and the temperature of the steam thermal anneal process 330 affect the amount of shrinkage.

Figure 7:
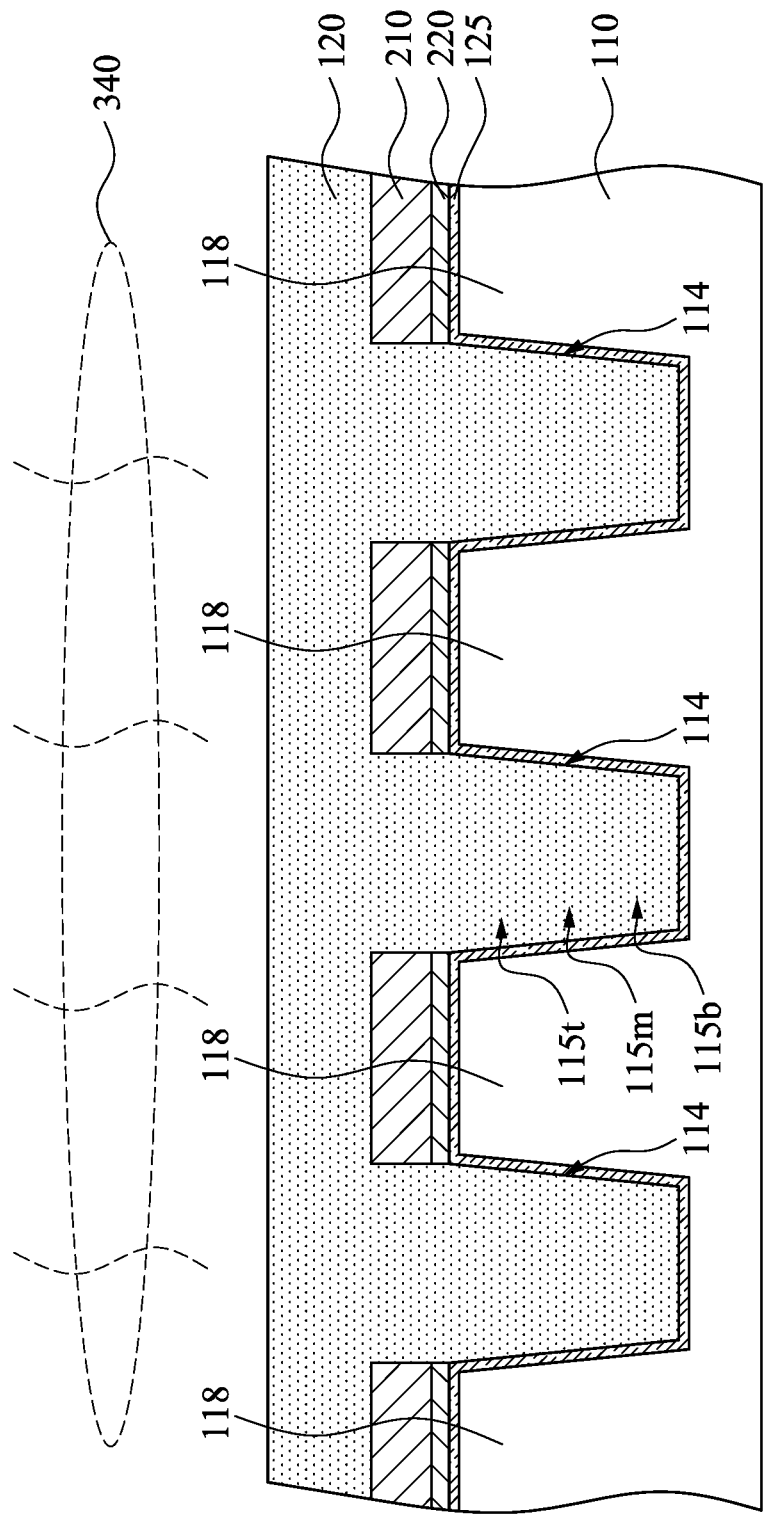

Reference is made to FIG. 7. After the steam thermal anneal process 330 described above, a "dry" (without steam) thermal anneal process 340 is conducted to convert the SiOH and SiO network into SiO (or $SiO_2$) network. During the dry thermal anneal process 340, steam is not used. In some embodiments, an inert gas, such as $N_2$, is used during the dry thermal anneal process 340. In some embodiments, the peak anneal temperature of the dry thermal anneal process 340 is in a range from about 1000° C. to about 1200° C. The dry thermal anneal process 340 is conducted in a furnace, in some embodiments. The pressure of the dry thermal anneal process 340 is in a range from about 500 Torr to about 800 Torr. The gas or gases used for the dry thermal anneal process 340 may include an inert gas, such as $N_2$, Ar, He or combinations thereof. The duration of the dry thermal anneal process 340 is a range from about 30 minutes to about 3 hours. The dry thermal anneal process 340 converts the network of SiOH and SiO in the flowable dielectric layer 120' to a network of SiO (or $SiO_2$). The dry thermal anneal process 340 may also cause flowable dielectric layer 120' to shrink further. The duration and temperature of the dry thermal anneal process 340 affect the amount of shrinkage.

The steam anneal process 330 and the dry thermal anneal process 340 cause flowable dielectric layer 120' to shrink. In some embodiments, the volume of the flowable dielectric layer 120' shrinks in a range from about 5% to about 20%. The duration of the anneal processes (330 and 340) affect the amount of shrinking.

After the steam thermal anneal process 330 of FIG. 6 and the dry thermal anneal process 340 of FIG. 7, a liner layer 125 is formed to conformally cover the trench 114 and the semiconductor fins 118. The liner layer 125 is formed due to the deposition and the annealing processes of the flowable dielectric layer 120'. That is, the liner layer 125 is formed together with the isolation structure 120. The liner layer 125 includes nitrogen, and may be made of silicon oxynitride, and the claimed scope is not limited in this respect.

The liner layer 125 has spatially various nitrogen concentration. In other words, the nitrogen concentration of the liner layer 125 is uneven distributed. For example, the nitrogen concentration of the liner layer 125 at the top portion 115t of the trench 114 is higher than the nitrogen concentration of the liner layer 125 at the bottom portion 115b of the trench 114. This is because the nitrogen of the mask layer 210, which may include nitrogen, can diffuse to the flowable dielectric layer 120' during the curing and the annealing processes. Hence, the nitrogen concentration of the liner layer 125 at the top portion 115t is higher. On the other hand, the concentration of NH ions of the flowable dielectric layer 120' is higher at the bottom portion 115b than at the top portion 115t. This may because the precipitation of the flowable dielectric layer 120' and/or the NH ions in the bottom portion 115b is not easy to be removed during the curing process. Therefore, the liner layer 125 at the bottom portion 115b includes a certain amount of the nitrogen. Although the nitrogen concentration of the liner layer 125 at the bottom portion 115b is lower than the nitrogen concentration of the liner layer 125 at the top portion 115t, the nitrogen concentration of the liner layer 125 at the bottom portion 115b is higher than the nitrogen concentration of the liner layer 125 at the middle portion 115m. Also, the nitrogen concentration of the liner layer 125 at the top portion 115t is higher than the nitrogen concentration of the liner layer 125 at the middle portion 115m. In some embodiments, the nitrogen concentrations of the liner layer 125 at the top portion 115t, the middle portion 115m, and the bottom portion 115b can be substantially 4:1:2, and the claimed scope is not limited in this respect.

Figure 8:
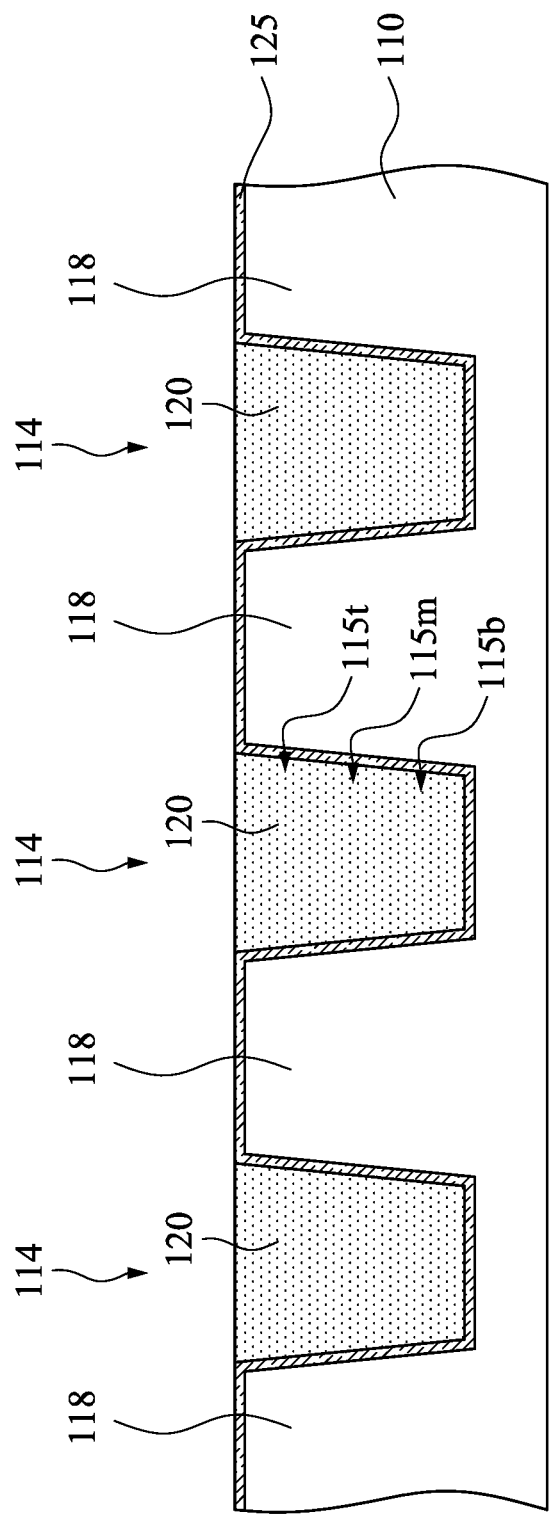

Reference is made to FIG. 8. After the dry thermal anneal process 340 of FIG. 7, the flowable dielectric layer 120' of the FIG. 7 is converted to $SiO_2$, and a planarization process 350 is performed to remove the flowable dielectric layer 120' outside the trench 114 to form the isolation structure 120. In some embodiments, the planarization process is a chemical-mechanical polishing (CMP) process. The planarization process removes the flowable dielectric layer 120' outside the trench 114, in some embodiments. In some embodiments, the planarization process also removes the mask layer 210 and the protective layer 220 (see FIG. 7). In some other embodiments, the planarization process removes the mask layer 210; however, the protective layer 220 is removed by an etching process.

After the excess flowable dielectric layer 120' outside the trench 114, the mask layer 210, and the protective layer 220 are removed, the trench structure is formed. In some embodiments, a gate dielectric and a gate electrode (not shown) can be formed on or above the semiconductor fins 118 to form a FinFET.

In FIG. 8, the trench structure includes the substrate 110, the isolation structure 120, and the liner layer 125. The substrate 110 has the trench 114. The isolation structure 120 is disposed in the trench 114. The liner layer 125 is disposed between the substrate 110 and the isolation structure 120. The liner layer 125 includes nitrogen, and the liner layer 125 has spatially various nitrogen concentration. In other words, a nitrogen concentration of the liner layer 125 is uneven distributed. In some embodiments, the trench structure of the semiconductor device is a shallow trench insulation (STI) structure, and the claimed scope is not limited in this respect.

In greater detail, the liner layer 125 is disposed adjacent to the substrate 110 and the isolation structure 120. The liner layer 125 also covers at least one of the semiconductor fins 118. For example, in FIG. 8, the liner layer 125 covers the semiconductor fins 118. The liner layer 125 can be a conformal layer whose horizontal portions and vertical portions have thicknesses close to each other. The liner layer 125 serves several purposes including reducing stress in the substrate 110, providing some minimal rounding of the trench 114 corners, and some protection against divot formation during a planarization procedure to remove excess flowable dielectric layer 120'. In some embodiments, the liner layer 125 is silicon oxynitride, and the isolation structure 120 is silicon dioxide ($SiO_2$).

According to the aforementioned embodiments, the trench is filled with flowable dielectric layer. The flowable dielectric layer can "flow" during deposition to fill voids in the trench. This technique can be used to fill trenches having high or low aspect ratios. Furthermore, since the liner layer and the isolation structure are both formed during the same manufacturing processes, an additional pre-formed liner layer can be omitted. Hence, the manufacturing time and the cost can both be reduced. The liner layer formed with the isolation structure has spatially various nitrogen concentration. In other words, the nitrogen concentration of the liner layer is uneven distributed.

While the above embodiments have been described with reference to STI structure, one skilled in the art will appreciate that the present disclosure could apply to various other structures in which it is desirable to fill a trench or gap, particularly a trench or gap having a high aspect ratio, with a good quality dielectric.

According to some embodiments, a method includes forming a flowable dielectric layer in a trench of a substrate; curing the flowable dielectric layer; and annealing the cured flowable dielectric layer to form an insulation structure and a liner layer. The insulation structure is formed in the trench, the liner layer is formed between the insulation structure and the substrate, and the liner layer includes nitrogen.

In some embodiments, the liner layer includes silicon oxynitride.

In some embodiments, the method further includes forming a plurality of semiconductor fins in the substrate, wherein the trench is formed between the semiconductor fins.

In some embodiments, the method further includes forming a mask layer on at least one of the semiconductor fins. A portion of the liner layer is formed between the mask layer and the semiconductor fin.

In some embodiments, the mask layer includes nitride.

In some embodiments, a gas used to form the flowable dielectric layer includes trisylamine (TSA).

In some embodiments, the annealing includes a steam thermal anneal and a dry thermal anneal.

In some embodiments, the flowable dielectric layer is cured using ozone ($O_3$).

In some embodiments, the method further includes performing a planarization process to remove a portion of the flowable dielectric layer outside the trench.

In some embodiments, the trench has a middle portion and a bottom portion, and the annealing is performed such that a nitrogen concentration of the liner layer at the middle portion is lower than a nitrogen concentration of the liner layer at the bottom portion.

According to some embodiments, a method includes etching a substrate to form a trench; filling the trench with a flowable dielectric layer; performing an oxidation treatment on the flowable dielectric layer; and performing at least one annealing treatment on the oxidized flowable dielectric layer to form an insulation structure and a liner layer. The insulation structure is formed in the trench, and the liner layer is formed between the insulation structure and the substrate.

In some embodiments, semiconductor fins are formed after the trench is formed, and the trench is disposed between the semiconductor fins. The method further includes forming a mask layer on at least one of the semiconductor fins. The mask layer includes nitrogen.

In some embodiments, the annealing treatment is performed such that the liner layer includes nitrogen, and a nitrogen concentration of the liner layer is unevenly distributed.

In some embodiments, at least one annealing treatment includes a steam thermal anneal and a dry thermal anneal.

According to some embodiments, a method includes forming a plurality of trenches in a substrate, wherein the trenches define a fin having a hard mask layer over a top of the fin; filling the trenches with a flowable dielectric layer; curing the flowable dielectric layer; and annealing the cured flowable dielectric layer, such that a liner includes nitrogen is formed between the hard mask layer and the top of the fin.

In some embodiments, the hard mask layer includes nitride.

In some embodiments, the annealing is performed such that an insulation structure is formed in at least one of the trenches, and the liner is further formed between the insulation structure and the substrate.

In some embodiments, the annealing is performed such that a nitrogen concentration of the liner between the hard mask layer and the top of the fin is higher than a nitrogen concentration of the liner between the insulation structure and the substrate.

In some embodiments, the curing includes performing an oxidation treatment on the flowable dielectric layer.

In some embodiments, the annealing includes a steam thermal anneal and a dry thermal anneal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a flowable dielectric layer comprising nitrogen in at least one trench of a substrate, wherein the flowable dielectric layer is in direct contact with the substrate at a sidewall of the at least one trench;
   curing the flowable dielectric layer; and
   annealing the cured flowable dielectric layer to form an insulation structure and a liner layer, wherein the annealing comprises a steam thermal anneal and a dry thermal anneal, the insulation structure is formed in the at least one trench, the liner layer is formed between the insulation structure and the substrate, and the liner layer comprises nitrogen.

2. The method of claim 1, wherein the liner layer comprises silicon oxynitride.

3. The method of claim 1, further comprising:
   forming a plurality of semiconductor fins in the substrate, wherein the at least one trench is formed between the semiconductor fins.

4. The method of claim 3, further comprising:
   forming a mask layer on at least one of the semiconductor fins, wherein a portion of the liner layer is formed between the mask layer and the semiconductor fin.

5. The method of claim 4, wherein the mask layer comprises nitride.

6. The method of claim 1, wherein a gas used to form the flowable dielectric layer comprises trisylamine (TSA).

7. The method of claim 1, wherein the flowable dielectric layer is cured using ozone ($O_3$).

8. The method of claim 1, further comprising:
   performing a planarization process to remove a portion of the flowable dielectric layer outside the at least one trench.

9. The method of claim 1, wherein the at least one trench has a middle portion and a bottom portion, and the annealing is performed such that a nitrogen concentration of the liner layer at the middle portion is lower than a nitrogen concentration of the liner layer at the bottom portion.

10. The method of claim 1, wherein the flowable dielectric layer is further in direct contact with the substrate at a bottom of the at least one trench.

11. A method, comprising:
    etching a substrate to form at least one trench;
    filling the at least one trench with a nitrogen-containing flowable dielectric layer;
    curing, using an oxidation treatment, the nitrogen-containing flowable dielectric layer; and
    performing a steam thermal annealing treatment and a dry thermal annealing treatment on the oxidized nitrogen-containing flowable dielectric layer to form an insulation structure and a liner layer, wherein a portion of the nitrogen-containing flowable dielectric layer and a portion of the substrate are converted to the liner layer after the steam thermal annealing treatment and the dry thermal annealing treatment are performed, the insulation structure is formed in the at least one trench, and the liner layer is formed between the insulation structure and the substrate.

12. The method of claim 11, wherein a plurality of semiconductor fins are formed after the at least one trench is formed, and the at least one trench is disposed between the semiconductor fins;
    further comprising:
    forming a mask layer on at least one of the semiconductor fins, wherein the mask layer comprises nitrogen.

13. The method of claim 11, wherein the steam thermal annealing treatment and the dry thermal annealing treatment are performed such that the liner layer comprises nitrogen, and a nitrogen concentration of the liner layer is unevenly distributed.

14. A method, comprising:
    forming a plurality of trenches in a substrate, wherein the trenches define a fin having a hard mask layer over a top of the fin;
    filling the trenches with a flowable dielectric layer comprising SiONH;
    curing the flowable dielectric layer; and
    annealing the cured flowable dielectric layer with a steam thermal anneal and a dry thermal anneal, such that a liner comprising silicon oxynitride is formed to have a first portion between the hard mask layer and the top of the fin and a second portion between an insulation structure and the substrate.

15. The method of claim 14, wherein the hard mask layer comprises nitride.

16. The method of claim 14, wherein the annealing is performed such that the insulation structure is formed in at least one of the trenches.

17. The method of claim 14, wherein the annealing is performed such that a nitrogen concentration of the first portion of the liner between the hard mask layer and the top of the fin is higher than a nitrogen concentration of the second portion of the liner between the insulation structure and the substrate.

18. The method of claim 14, wherein the curing comprises:
    performing an oxidation treatment on the flowable dielectric layer.

19. The method of claim 14, wherein the annealing is performed such that a first nitrogen concentration of the first portion of the liner is higher than a second nitrogen concentration of the second portion of the liner.

20. The method of claim 14, wherein a portion of the flowable dielectric layer and a portion of the substrate are converted to the liner after the steam thermal annealing treatment and the dry thermal annealing treatment are performed.

* * * * *